(12) United States Patent
Hasper et al.

(10) Patent No.: US 6,481,945 B1
(45) Date of Patent: Nov. 19, 2002

(54) METHOD AND DEVICE FOR TRANSFERRING WAFERS

(75) Inventors: Albert Hasper, Ev Meppel (NL); Frank Huussen, Pe Bilthoven (NL); Cornelis Marinus Kooijman, Kd Nieuwegein (NL); Theodorus Gerardus Maria Oosterlaken, Gt Oudewater (NL); Jack Herman Van Putten, Den Dolder (NL); Christianus Gerardus Maria Ridder, Bk Hoogland (NL); Gert-Jan Snijders, Xk Rotterdam (NL); Jeroen Jan Stoutjesdijk, Sx Bussum (NL); Jan Zinger, Bd Dwingeloo (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 09/719,334

(22) PCT Filed: Jun. 4, 1999

(86) PCT No.: PCT/NL99/00353

§ 371 (c)(1),
(2), (4) Date: Dec. 5, 2000

(87) PCT Pub. No.: WO99/65064

PCT Pub. Date: Dec. 16, 1999

(30) Foreign Application Priority Data

Jun. 5, 1998 (NL) .............................. 1009327

(51) Int. Cl.[7] .............................................. B65G 49/07
(52) U.S. Cl. ...................... 414/217; 414/939; 414/940; 414/805
(58) Field of Search ................ 414/217, 217.1, 414/411, 416.02, 416.08, 937, 939, 940, 805, 811

(56) References Cited

U.S. PATENT DOCUMENTS

| 5,169,272 | A | * | 12/1992 | Bonora et al. ............ 414/217.1 |
| 5,364,219 | A | * | 11/1994 | Takahashi et al. ........... 414/217 |
| 5,431,600 | A | * | 7/1995 | Murata et al. ............... 414/940 |
| 5,609,459 | A | * | 3/1997 | Muka ....................... 414/217.1 |
| 5,674,123 | A | * | 10/1997 | Roberson, Jr. et al. ...... 414/940 |
| 5,752,796 | A | * | 5/1998 | Muka ....................... 414/217.1 |
| 5,772,386 | A | * | 6/1998 | Mages et al. ............... 414/939 |
| 6,042,324 | A | * | 3/2000 | Aggarwal et al. ........... 414/217 |
| 6,082,951 | A | * | 7/2000 | Nering et al. ............... 414/939 |
| 6,120,229 | A | * | 9/2000 | Hofmeister ................. 414/217 |

FOREIGN PATENT DOCUMENTS

| DE | 38 36 696 C | 12/1998 | |
| EP | 0 565 001 a | 10/1993 | |
| JP | 4-206547 | * 7/1992 | ................. 414/940 |
| WO | WO 96 26874 A | 9/1996 | |

* cited by examiner

*Primary Examiner*—James W. Keenan
(74) *Attorney, Agent, or Firm*—Knobbe, Martens, Olson & Bear, LLP

(57) ABSTRACT

Enhanced inserts are formed having a cylindrical grip and a protrusion extending from the grip. An ultra hard material layer is bonded on top of the protrusion. The inserts are mounted on a rock bit and contact the earth formations off center. The ultra hard material layer is thickest at a critical zone which encompasses a major portion of the region of contact between the insert and the earth formation. Transition layers may also be formed between the ultra hard material layer and the protrusion so as to reduce stresses formed on the interface between the ultra hard material and the protrusion.

6 Claims, 3 Drawing Sheets

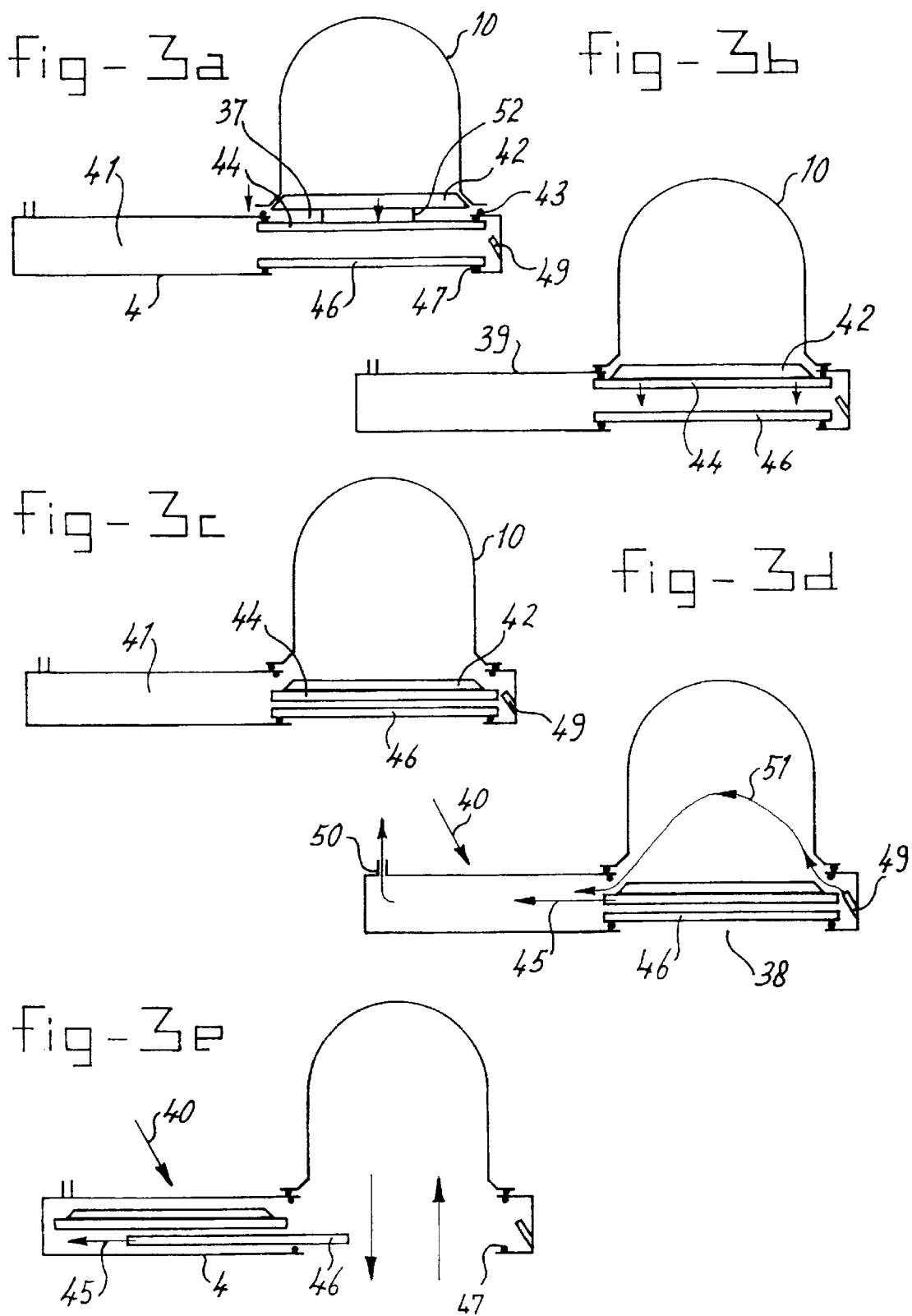

METHOD AND DEVICE FOR TRANSFERRING WAFERS

FIELD OF THE INVENTION

The present invention relates to a device and a method for transferring wafers to and from FOUP type cassettes.

A device of this type is disclosed in WO 96/26874.

BACKGROUND OF THE INVENTION

For transporting wafers use is made of cassettes provided with a cover fitted such that it is removable. Said cover can be provided to a greater or lesser extent with a gastight seal with respect to the other part of the cassette. If the wafers have, for example, to be treated in a furnace, the wafers are removed from the cassette and placed in a wafer rack and said wafer rack is then introduced, together with the wafers, into the furnace. After the treatment the wafers together with the rack are removed from the furnace and the wafers are transferred back to the cassette and transported for further treatment.

In general, treatment devices such as furnaces are under a controlled atmosphere, for example an inert nitrogen atmosphere, during loading or removal. It is necessary also to bring the wafers: into such an atmosphere. Numerous proposals are disclosed in the prior art for bringing the wafers into the controlled atmosphere of the treatment device before said wafers enter the chamber in which the treatment device has been arranged.

A first proposal comprises fitting a connection on the cassettes. Said connection engages, in the cassette storage device, which storage device can contain several tens of cassettes, on a coupling piece arranged in the storage device and, after connecting the cassette and the storage device, purging with the gas concerned takes place through said connection. Because the wafers fit accurately in the cassettes, it has been found that a completely homogeneous atmosphere can be achieved only with very great difficulty. A very large quantity of gas is required for this, whilst under normal conditions it cannot be guaranteed that every part of the cassette chamber has been provided with the controlled atmosphere.

Another proposal is not to remove the wafers directly from the cassette in order to place these in a wafer rack but to provide a lock construction in which the cassette is accommodated in its entirety. In a lock chamber of this type the atmosphere is then changed to the controlled atmosphere. It has been found that the various operations are time consuming, whilst the chamber for accommodating the cassette in turn adds additional floor area to the complete treatment device.

A construction having a lock chamber is described in WO 96/26874.

This construction is provided with a single closure which closes off both the first and the second opening. With this arrangement the first opening is made in a component that is movable with respect to the rest of the construction. Opening is effected by moving said movable component away from the closure.

This construction has the disadvantage that the lock chamber has a moving part. As a result of the movement, dust or other particles can be released which give rise to undesirable contamination. Furthermore, this construction is bulky and complex. Consequently the space requirements for such a lock construction is appreciable. This plays a role especially when larger wafers are used. Moreover, as a consequence of the possibility of part of the wall of the lock chamber being movable, the lock chamber has a relatively large volume, which makes purging thereof more difficult. Furthermore, it is a disadvantage that movement of the cassette relative to the lock chamber takes place during the operation for loading/unloading the cassette.

SUMMARY OF THE INVENTION

The aim of the present invention is to avoid these disadvantages and to provide a simple construction with which communication with the lock chamber can be achieved without moving the cassette and with which it is possible to purge the cassette chamber separately from the surroundings in a simple manner.

By using two separate closures in the lock chamber it is possible to close off both the first and the second opening individually. Moreover, it is no longer necessary to fit moving wall sections in the lock chamber. The construction according to the invention can be made appreciably more compact, as a result of which the volume of the lock chamber is reduced. Consequently the space requirement for the entire treatment device can be reduced. Furthermore, it is then possible in a simple manner to pass gas through both the lock chamber and the cassette using a relatively small quantity of gas. Said gas can be a purging gas. Preferably, the supply means for such a gas are constructed such that the stream of gas initially moves into the space in the cassette.

According to the invention the cassette is preferably a cassette of the so-called FOUP type. In this case the cassette rack is mounted such that it is fixed in the housing and the wafers are removed from the cassette in the direction of the plane thereof. This is in contrast to a so-called SMIF cassette, with which the wafer rack is mounted such that it is movable in the housing and the wafers, together with the wafer rack, are removed from the cassette in the direction perpendicular to the plane of the wafers.

With the aid of the invention it is possible to carry out purging via a cover for the cassettes. By initially only partially opening the cassette cover it is possible, on the one hand, to obtain good access to all levels of the wafers and, on the other hand, the quantity of purging fluid is restricted as far as possible. If use is made of a lock construction close to the opening it is possible to subsequently remove the cover completely.

Preferably, the closures described above are constructed as flat plates, which both move away to the side.

The invention also relates to an assembly consisting of the device described above and a cassette, the cassette being constructed as a FOUP cassette.

The invention also relates to a method for transferring wafers from/to cassettes in a lock chamber, wherein the cassette is positioned with the side to be opened against the lock chamber, such that the closure of the cassette is coincident with a closure for a first opening of said lock chamber, after which the closure of the cassette, together with the closure of the lock chamber, is removed into the lock chamber, which lock chamber is provided with a further closable opening for removing/feeding said wafers from/to the lock chamber, wherein during the removal of the closure of the cassette the further opening is closed and a purging gas is fed through said lock chamber, followed by opening of said further opening.

The invention will be explained in more detail below with reference to an illustrative embodiment shown in the drawings.

SUMMARY OF THE DRAWINGS

FIGS. 3a –e show the lock according to the invention in more detail in various positions.

DETAILED DESCRIPTION OF A PREFERRED EMBODIMENT

Figure 2:
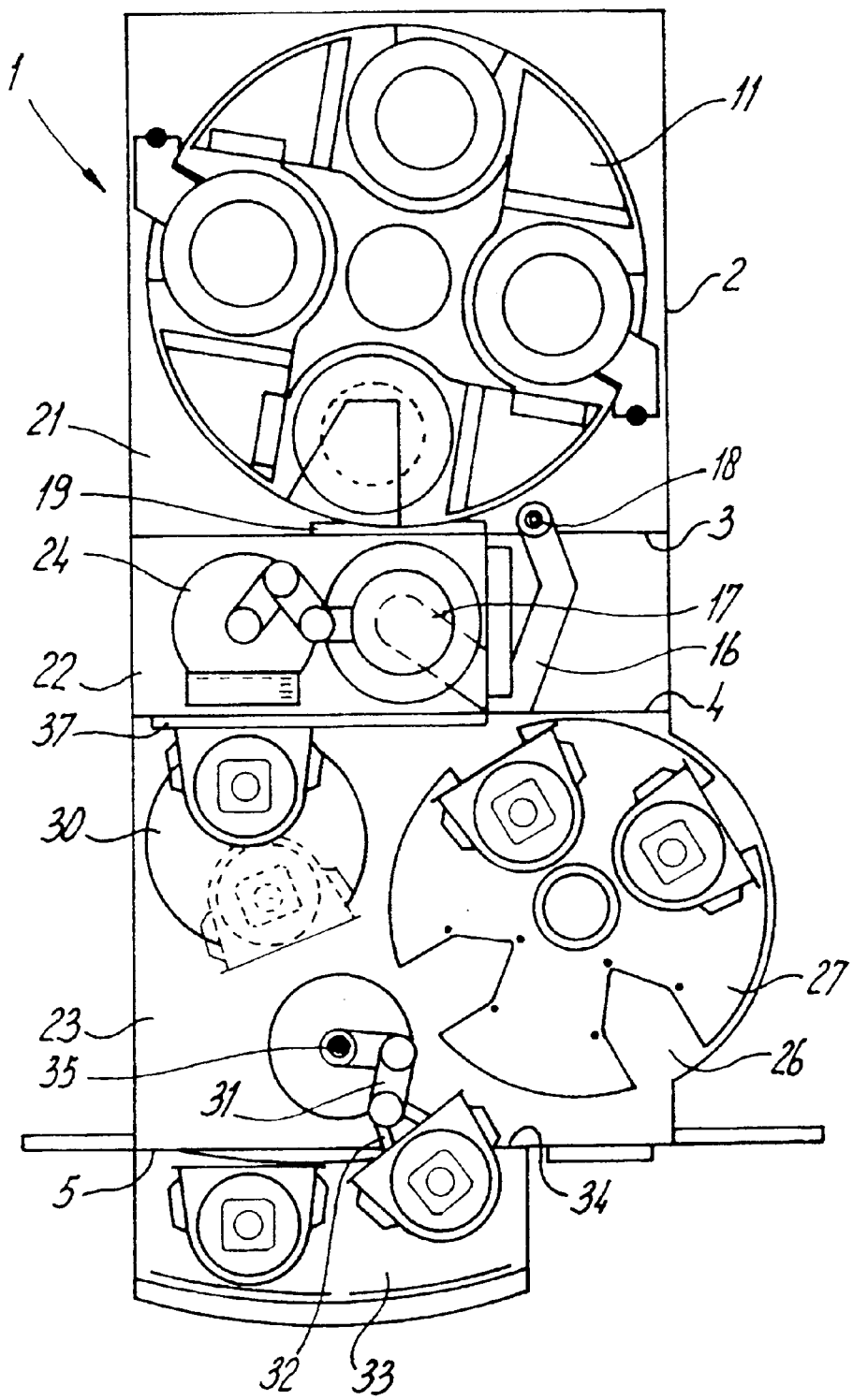
FIG. 2 shows, diagrammatically, a plan view of the device according to FIG. 1.

The device according to the invention is indicated in its entirety by 1. Said device comprises a housing 2 and will in general have been installed in a so-called "clean room". In addition to housing 2, partitions 3, 4 and 5 are also present, as can be seen in particular from FIG. 2. Housing 2 delimits, with partition 3, reactor area or chamber 21. A chamber 22 in which the intermediate store according to the invention is located is delimited between housing 2 and partitions 3, 4. A chamber 23 is delimited between partitions 4 and 5 and housing 2. 33 is the introduction chamber. Two reactors, which in this case comprise furnaces 6, 7, are arranged in reactor chamber 21. Said furnaces are positioned vertically and wafer racks, indicated by 12, filled with wafers 13, are introduced into the furnaces 6, 7 in the vertical direction from below. To this end each furnace has an insertion arm 14, which is movable in the vertical direction. Only one insertion arm 14 can be seen in the drawing. The wafer rack 12 is provided at the bottom with an insulating plug, which is not indicated in more detail, which provides a seal with respect to the furnace. Special measures are taken to optimise the operation in the furnace.

A rotary platform 11, provided with cut-outs 15, is fitted. Said cut-outs 15 are shaped such that, if the cut-outs 15 have been brought into the correct position, arm 14 is able to move up and down through the cut-outs. On the other hand, the diameter of the bottom of the wafer rack is such that said diameter is larger than the cut-out 15 in the platform 11, so that when the arm 14 moves downwards from the position shown in FIG. 1 the wafer rack 12 can be placed on rotary platform 11 and can be removed therefrom again in a reverse operation.

The wafer racks can be fed to both furnace 6 and furnace 7. It is possible to perform a successive treatment therein. It is also possible to allow parallel groups of wafer racks to be treated exclusively by furnace 6 and exclusively by furnace 7. Said wafer racks must be provided with wafers. After all, wafers 13 are supplied in (transport) cassettes 10 which, from the introduction chamber 33, are placed in store 8 through a closable opening 34 with the aid of arm 31. Arm 31 is provided with a bearing surface 32 which has dimensions a little smaller than those of the series of cut-outs 26 in rotary platforms 27. A number of such rotary platforms are provided one above the other in the vertical direction in store 8. Arm 31 is movable in the vertical direction with the aid of height adjuster 35. Arm 31 is mounted such that said arm is able not only to pick up/remove cassettes from/to introduction chamber 33 to/from store 8, but that it is also possible to move cassettes from/to store 8 to/from rotary platform 30. Said rotary platform 30 is constructed such that on rotation the cassette is placed against partition 4 where an opening 37 has been made so that, after opening the cassettes, wafers can be taken one by one from the cassette concerned with the aid of arm 24 and can be placed in the wafer rack 12 located in chamber 22. Said wafer rack 12 is supported by hinged arm 16 which is provided with a bearing surface 17 at the end, the dimensions of which are once again somewhat smaller than those of cut-outs 15. Said arm 16 is able to move with the wafer rack through a closable opening in partition 3. A closure is provided in order to be able to close opening 19 between chambers 21 and 22.

Figure 1:
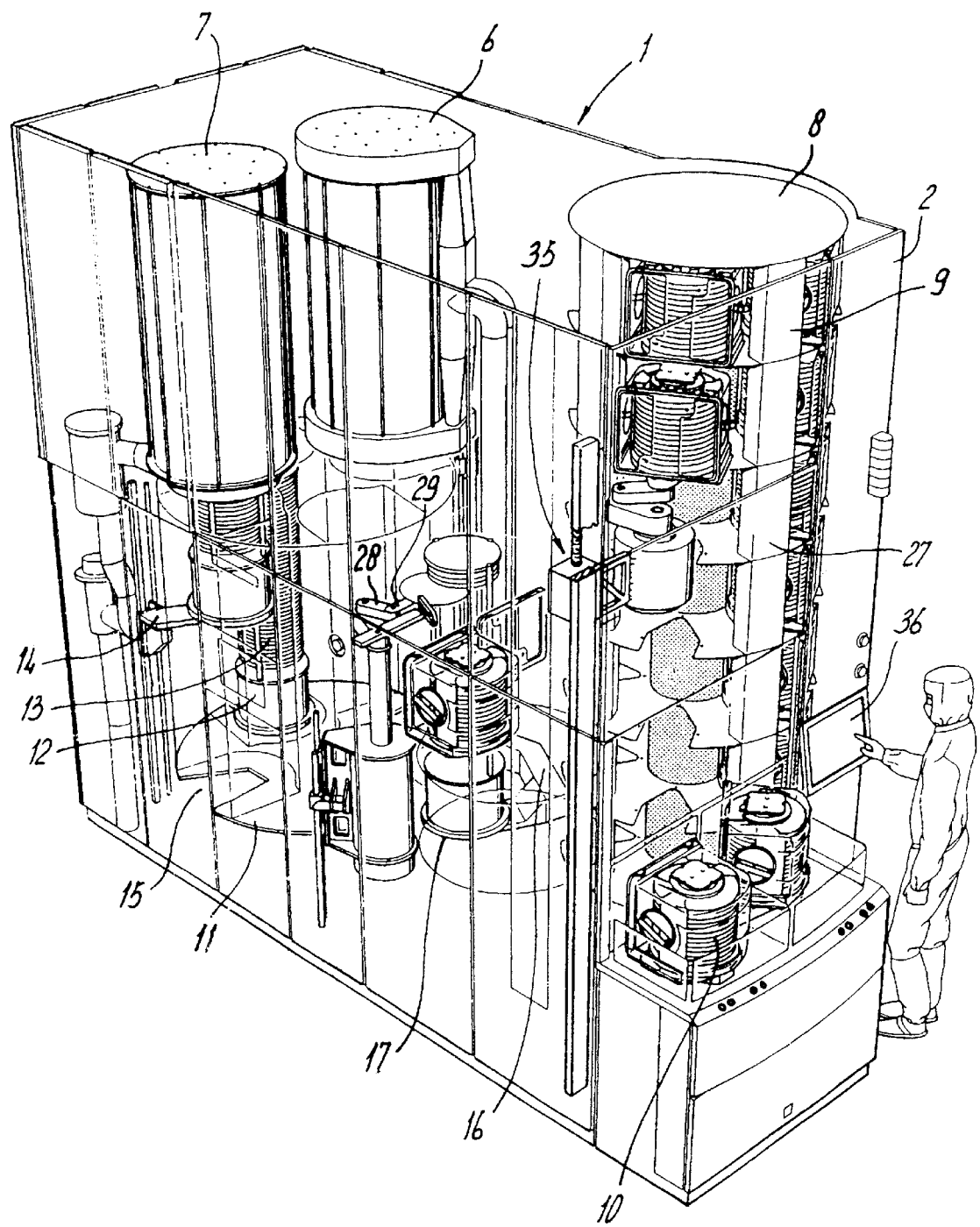
FIG. 1 shows, diagrammatically and partially exposed, a perspective view of the device according to the invention.

The treatment of a large number of wafers can be carried out as follows:

The operator, shown diagrammatically in FIG. 1, loads a store 8 by introducing a number of cassettes and carrying out control operations on panel 36. Each of the cassettes 10 is transferred from the introduction chamber 33 with the aid of arm 31 into the storage compartments 9 made for these cassettes in store 8. This means that, starting from the lowest position for removing the relevant cassette 10 from chamber 33 through the opening 34, said cassette can then be moved upwards for moving into a higher compartment 9 of the store 8. By rotation of the store 8 it is possible to fill various compartments with cassettes 10.

After filling store 8 no further human intervention is required with the automated embodiment of the device according to the present invention. The cassettes 10 concerned are then removed from the store by arm 31 and placed on rotary platform 30. The cassettes are rotated on the rotary platform and placed against partition 4. With the aid of arm 24, the wafers are removed wafer by wafer and placed in wafer rack 12 placed on swing arm 16. In the interim the rotary platform 11 is able to move in the reactor chamber 21 in an optimum manner with regard to the treatments to be carried out on the wafers present inside the reactor chamber 21. After wafer rack 12 has been filled in chamber 22 and has become or becomes available to one of the reactors 6, 7, opening 19, which was closed up to this time, is exposed and said filled wafer rack is placed on rotary platform 11. Said rotary platform then moves one position immediately or later and a filled wafer rack 12 is removed from platform 11. Treated wafers are located on said filled platform. Said wafers execute a movement counter to the above.

Further details on this device are to be found in Netherlands Patent 1 008 143.

As can be seen in particular from FIGS. 3a –e, lock 40 according to the invention is arranged close to wall 4. Said lock consists of a lock chamber 41, delimited on one side by wall 4 and delimited on the other side by auxiliary wall 39. Both wall 4 and auxiliary wall 39 are provided with an opening, 38 and 37 respectively. Opening 38 is closable with the aid of a closure plate 46. Via seal 47 a perfect seal with respect to wall 40 is ensured. Opening 37 is closed off with the aid of gripper plate 44. The latter is provided with a coupling 52, shown diagrammatically, in order to engage on cover 42. Seal 43 provides a seal between the cassette housing 10 and auxiliary wall 39.

49 indicates a gas feed, whilst 50 indicates a gas discharge.

In the position shown in FIG. 3a, the cassette 10 is just placed against auxiliary wall 39 so as to produce a seal. Locking of gripper plate 45 and closure 42 then takes place (FIG. 3b), after which the assembly concerned is first moved forwards (downwards in the drawing) and then in the direction of arrow 45 (FIGS. 3b, c). Under these conditions closure plate 46 is still in sealing engagement with wall 4. During or after opening cassette 10, gas is blown into the cassette space via gas feed 49 (FIG. 3d). This can take place over the entire height of the cassette, that is to say between all wafers arranged in the cassette. On partial opening of closure 42, the gas stream indicated by arrow 51 in FIG. 3d is produced. That is to say, the flow of gas through the entire cassette 10 is ensured. Closure plate 46 is then moved away in accordance with arrow 45 (FIG. 3e) and the wafers can be moved.

Those skilled in the art will understand that numerous modifications to the above are possible. For instance, it is possible for one reactor to suffice or for more than two reactors to be present. The store can be of different construction, whilst the various displacement mechanisms can likewise be adjusted depending on the requirement. Such modifications are all considered to fall within the scope of the present claims.

What is claimed is:

1. A device for transferring wafers from and to cassettes, comprising:

a lock chamber having a first opening in a first wall, wherein the first opening is configured to engage with a cassette housing to receive cassettes and a second opening in a second wall opposite the first wall, wherein the second opening is configured for moving the wafers to a treatment device, wherein the first and second openings are directly opposite to each other, at least one first closure device configured to close said first opening, wherein the first closure device is configured to receive a cover of said cassette housing, a gas feed and a gas discharge provided in said lock chamber, and a second closure device provided separate from said first closure device and configured to close said second opening, wherein said first and second closure devices are adjacent and parallel to each other.

2. The device according to claim 1, wherein said gas feed is configured to move a stream of gas into said cassette.

3. The device according to claim 1, wherein said closure devices comprise essentially flat plates, both of which are movable in a plane of said first opening and, respectively, second opening, in order to expose said openings.

4. An assembly comprising a cassette housing containing a wafer rack and a device for transferring wafers from and to cassettes, the device comprising:

a lock chamber having a first opening in a first wall, wherein the first opening is configured to engage with a cassette housing to receive cassettes and a second opening in a second wall opposite the first wall, wherein the second opening is configured for moving the wafers to a treatment device, wherein the first and second openings are directly opposite to each other, at least one first closure device configured to close said first opening, wherein the first closure device is configured to receive a cover of said cassette housing, a gas feed and a gas discharge provided in said lock chamber, a second closure device provided separate from said first closure device and configured to close said second opening, wherein said first and second closure devices are adjacent and parallel to each other.

5. The assembly according to claim 4, wherein a plane of an accommodation for the wafers in the cassette is essentially perpendicular to a plane of the first opening.

6. A method for transferring wafers from and to cassettes in a lock chamber having a first opening in a first wall and a second opening in a second wall directly opposite the first wall, a first closure device for the first opening and a second closure device for the second opening, comprising:

placing the cassette against the lock chamber such that a cover of the cassette is coincident with the first closure device for the first opening of said lock chamber;

releasing the cover of the cassette onto said first closure device of the lock chamber;

moving the first closure device with the cover into the lock chamber, wherein during moving the cover of said cassette the second opening is closed;

feeding purging gas through said lock chamber; and opening of said second opening by moving said second closure device in a direction parallel to said second opening, wherein said cassette remains stationary relative to said lock chamber during opening of said cassette, and wherein said first and second closure devices move independently from each other.

* * * * *

UNITED STATES PATENT AND TRADEMARK OFFICE
CERTIFICATE OF CORRECTION

PATENT NO.    : 6,481,945 B1                                            Page 1 of 1
DATED         : November 19, 2002
INVENTOR(S)   : Hasper et al.

It is certified that error appears in the above-identified patent and that said Letters Patent is hereby corrected as shown below:

Title page,
Item [57], ABSTRACT, please correct to read as follows:
-- A device for transferring wafers from and to cassettes has a lock chamber having a first opening in a first wall, wherein the first opening is configured to engage with a cassette housing to receive cassettes and a second opening in a second wall directly opposite the first wall. The second opening is configured for moving the wafers to a treatment device. At least one first closure device closes the first opening and receives a cover of the cassette housing. A gas feed and a gas discharge are provided in the lock chamber. A second closure device is separate from the first closure device and closes the second opening, wherein the first and second closure devices are adjacent and parallel to each other. --

Signed and Sealed this

Eighteenth Day of February, 2003

JAMES E. ROGAN
*Director of the United States Patent and Trademark Office*